United States Patent

Nishimura et al.

[11] Patent Number: 5,822,350
[45] Date of Patent: Oct. 13, 1998

[54] SEMICONDUCTOR LASER

[75] Inventors: Takashi Nishimura; Shoichi Karakida; Motoharu Miyashita; Diethard Marx, all of Tokyo, Japan

[73] Assignee: Mitsubishi Denki Kabushiki Kaisha, Tokyo, Japan

[21] Appl. No.: 711,744

[22] Filed: Sep. 10, 1996

[30] Foreign Application Priority Data

Feb. 29, 1996 [JP] Japan .................................. 8-042755

[51] Int. Cl.⁶ ...................................................... H01S 3/19
[52] U.S. Cl. .............................................. 372/46; 372/45
[58] Field of Search ......................... 372/46, 45; 437/129

[56] References Cited

U.S. PATENT DOCUMENTS

| | | | |
|---|---|---|---|
| 5,185,755 | 2/1993 | Mori et al. | 372/46 |
| 5,268,328 | 12/1993 | Mori et al. | 437/129 |
| 5,361,271 | 11/1994 | Takiguchi et al. | 372/45 |
| 5,383,214 | 1/1995 | Kidoguchi et al. | 372/45 |
| 5,395,792 | 3/1995 | Ikawa et al. | 437/129 |
| 5,442,649 | 8/1995 | Kokubo et al. | 372/46 |
| 5,499,260 | 3/1996 | Takahashi et al. | 372/46 |
| 5,587,334 | 12/1996 | Naito et al. | 437/129 |

FOREIGN PATENT DOCUMENTS 408373  1/1991  European Pat. Off. .
58-190087  11/1983  Japan .

OTHER PUBLICATIONS

Shima et al., "0.78–and 0.98–$\mu$m Ridge–Waveguide Lasers Buried With AlGaAs Confinement Layer Selectively Grown by Chloride–Assisted MOCVD", IEEE Journal of Selected Topics in Quantum Electronics, vol. 1, No. 2, Jun. 1995, pp. 102–109.

*Primary Examiner*—Rodney B. Bovernick
*Assistant Examiner*—Yisun Song
*Attorney, Agent, or Firm*—Leydig, Voit & Mayer

[57] ABSTRACT

A semiconductor laser includes a ridge structure includes a cladding layer having a thermal expansion coefficient. Current blocking structures are disposed at both sides of the ridge structure and include $Al_xGa_{1-x}As$ first current blocking layers having an Al composition x larger than 0.7 and contacting the ridge structure. In this structure, even when the Al composition of the first current blocking layers is reduced at both sides of the ridge structure, the wavelength of light absorbed by the first current blocking layers does not exceed the wavelength of laser light produced in the active layer. Therefore, unwanted absorption of the laser light at both sides of the ridge structure is avoided, resulting in a semiconductor laser with improved laser characteristics.

16 Claims, 11 Drawing Sheets

SEMICONDUCTOR LASER

FIELD OF THE INVENTION

The present invention relates to a buried-ridge semiconductor laser and a method of fabricating the semiconductor laser.

BACKGROUND OF THE INVENTION

FIG. 13 is a cross-sectional view illustrating a buried-ridge AlGaAs semiconductor laser including AlGaAs current blocking layers, disclosed in IEEE JOURNAL OF SELECTED TOPICS IN QUANTUM ELECTRONICS, June 1995, Vol. 1, No. 2, pp. 102–109. FIG. 14 is an enlarged view of a part of the semiconductor laser shown in FIG. 13.

As shown in FIG. 13, the semiconductor laser includes an n type GaAs substrate 1 having a (100) surface orientation. An n type $Al_{0.5}Ga_{0.5}As$ lower cladding layer 2 having a thickness of 1.5 $\mu$m is disposed on the surface of the substrate 1. A triple quantum well (hereinafter referred to as TQW) active layer 3 having a thickness of 80 nm is disposed on the lower cladding layer 2. As shown in FIG. 14, the TQW active layer 3 comprises three $Al_{0.1}Ga_{0.9}As$ well layers 31 and two $Al_{0.35}Ga_{0.65}As$ barrier layers 32 which are alternatingly laminated, and two $Al_{0.35}Ga_{0.65}As$ guide layers 33 sandwiching the laminated structure of the well layers 31 and the barrier layers 32. This TQW active layer 3 produces laser light having a wavelength of 0.78 $\mu$m. A p type $Al_{0.5}Ga_{0.5}As$ upper cladding layer 4 having a thickness of 1.5 $\mu$m is disposed on the TQW active layer 3, and a p type GaAs cap layer 5 having a thickness of 0.5 $\mu$m is disposed on the upper cladding layer 4. The upper cladding layer 4 and the cap layer 5 form a ridge structure 41 having a reverse mesa cross section, in the center of the laser structure. N type $Al_{0.7}Ga_{0.3}As$ first current blocking layers 6 and n type GaAs second current blocking layers 7 are disposed at both sides of the ridge structure 41 so that the ridge structure 41 is buried with these layers 6 and 7. The first current blocking layers 6 are 1.3 $\mu$m thick and the second current blocking layers 7 are 0.5 $\mu$m thick. A p type GaAs contact layer 8 having a thickness of 2 $\mu$m is disposed on the second current blocking layers 7 and on the top of the ridge structure 41. A p side electrode 12 is disposed on the contact layer 8 and an n side electrode 11 is disposed on the rear surface of the n type GaAs substrate 1.

FIGS. 15(a)–15(d) are cross-sectional views illustrating process steps in a method of fabricating the prior art semiconductor laser.

Initially, the n type $Al_{0.5}Ga_{0.5}As$ lower cladding layer 2, the TQW active layer 3, the p type $Al_{0.5}Ga_{0.5}As$ upper cladding layer 4, and the p type GaAs cap layer 5 are successively grown on the (100) surface of the n type GaAs substrate 1 by MOCVD (Metal Organic Chemical Vapor Deposition) at a growth temperature of 700° C. (FIG. 15(a)).

Thereafter, an SiN film 9 is deposited on the p type GaAs cap layer 5 by vacuum evaporation and patterned in a stripe in the <011> direction by photolithography and etching. Using the SiN film 9 as a mask, the p type GaAs cap layer 5 and the p type $Al_{0.5}Ga_{0.5}As$ upper cladding layer 4 are wet etched to form the ridge structure 41 (FIG. 15(b)).

In the step of FIG. 15(c), using the SiN film 9 as a mask, the n type $Al_{0.7}Ga_{0.3}As$ first current blocking layers 6 and the n type GaAs second current blocking layers 7 are successively grown on the upper cladding layer 4 at both sides of the ridge structure 41 by MOCVD at a growth temperature of 650° C.

After removal of the SiN film 9, the p type GaAs contact layer 8 is grown over the entire surface by MOCVD at a growth temperature of 650° C. (FIG. 15(d)). Finally, the n side electrode 11 and the p side electrode 12 are produced, by vacuum evaporation, on the rear surface of the substrate 1 and the contact layer 8, respectively, to complete the laser structure shown in FIG. 13.

A description is given of the operation of the semiconductor laser.

When a forward bias voltage is applied across the p side electrode 12 and the n side electrode 11, electrons are injected into the TQW active layer 3 through the n type GaAs substrate 1 and the n type $Al_{0.5}Ga_{0.5}As$ lower cladding layer 2, and holes are injected into the TQW active layer 3 through the p type GaAs contact layer 8, the p type GaAs cap layer 5, and the p type $Al_{0.5}Ga_{0.5}As$ upper cladding layer 4. In the active layer 3, the electrons and holes recombine to generate induced light. When the quantity of the injected carriers, i.e., electrons and holes, is sufficient to produce light exceeding the light lost in the waveguide, laser oscillation occurs.

In this prior art semiconductor laser, since the Al composition of the n type $Al_{0.7}Ga_{0.3}As$ first current blocking layers 6 is larger than the Al composition of the p type $Al_{0.5}Ga_{0.5}As$ upper cladding layer 4, the refractive index of the p type $Al_{0.5}Ga_{0.5}As$ upper cladding layer 4 is larger than the refractive index of the n type $Al_{0.7}Ga_{0.3}As$ first current blocking layers 6. Therefore, laser light produced in the TQW active layer 3 is guided in the ridge structure including the p type $Al_{0.5}Ga_{0.5}As$ upper cladding layer 4.

FIG. 16 is a graph illustrating a photoluminescence (PL) spectrum of the n type $Al_{0.7}Ga_{0.3}As$ first current blocking layers 6 at both sides of the ridge structure 41, at room temperature (about 25° C.). As can be seen from FIG. 16, the peak wavelength of the PL spectrum is 810 nm, and this is longer than the wavelength, 780 nm, of laser light produced in the TQW active layer 3. This fact indicates that light produced in the TQW active layer is absorbed at both sides of the ridge structure 41. The reason for the absorption of laser light will be described. In the prior art semiconductor laser, since the ridge structure 41 is formed by wet etching, (111)A planes are exposed at side surfaces 42 of the ridge structure 41. When the n type $Al_{0.7}Ga_{0.3}As$ first current blocking layers 6 are grown on the (111)A planes, the Al composition of the current blocking layers 6 varies and becomes lower than the Al composition of the $Al_{0.5}Ga_{0.5}As$ upper cladding layer 4, so that light produced in the TQW active layer 3 is absorbed by the first current blocking layers 6 at both sides of the ridge structure 41. As a result, the laser characteristics are degraded, for example, the threshold current is increased.

When a current blocking layer comprises a mixed crystal of three or more elements as the n type $Al_{0.7}Ga_{0.3}As$ first current blocking layer 6, the composition of the current blocking layer is not uniform. During the crystal growth of the current blocking layer, especially at both sides of the ridge structure, various crystal planes appear before the current blocking layers completely bury the ridge structure. Although the appearance of the crystal planes depends on the growth conditions, since the migration rates of constituent elements of the current blocking layer usually differ at the different crystal planes, the growth rate, differs according to the kinds of the elements. Therefore, even when a source material is supplied at a constant rate, the composition of the grown layer varies due to the crystal planes, resulting in a current blocking layer with uneven composition. Such an uneven composition causes a variation in refractive index or absorption of laser light at both sides of the ridge. As a result, the laser characteristics are degraded, and the reproducibility of the laser characteristics is degraded.

Furthermore, in the prior art semiconductor laser shown in FIG. 13, the thermal expansion coefficient of the p type $Al_{0.5}Ga_{0.5}As$ upper cladding layer 4 is $5.09 \times 10^{-6}$/K while the thermal expansion coefficient of the n type $Al_{0.7}Ga_{0.3}As$ first current blocking layer 6 is $4.74 \times 10^{-6}$/K, so the difference in the thermal expansion coefficients between these layers 4 and 6 is considerable. In addition, the n type $Al_{0.7}Ga_{0.3}As$ first current blocking layers 6 are as thick as 1.3 µm. Therefore, a great stress is applied to the ridge structure 41 due to the difference in thermal expansion coefficients between the p type $Al_{0.5}Ga_{0.5}As$ upper cladding layer 4 in the ridge structure 41 and the n type $Al_{0.7}Ga_{0.3}As$ first current blocking layers 6 outside the ridge structure 41, whereby the ridge structure 41 is destroyed, resulting in a reduction in the lifetime of the laser.

SUMMARY OF THE INVENTION

It is an object of the present invention to provide a semiconductor laser that prevents absorption of laser light at both sides of a ridge structure and ensures excellent laser characteristics.

It is another object of the present invention to provide a semiconductor laser that reduces stress applied to a ridge structure and increases reliability and lifetime.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser comprises a ridge structure; a cladding layer included in the ridge structure and having a thermal expansion coefficient; and current blocking structures disposed at both sides of the ridge structure and including $Al_xGa_{1-x}As$ first current blocking layers having an Al composition x larger than 0.7 and contacting the ridge structure. In this structure, even when the Al composition of the first current blocking layers is reduced at both sides of the ridge structure, the wavelength of the first current blocking layers does not exceed the wavelength of laser light produced in the active layer. Therefore, unwanted absorption of the laser light at both sides of the ridge structure is avoided, resulting in a semiconductor laser with improved laser characteristics.

According to a second aspect of the present invention, in the above-mentioned semiconductor laser, the first current blocking layers have a thickness less than 0.7 µm. Therefore, in addition to the above-mentioned effects, a stress applied to the ridge structure due to a difference in thermal expansion coefficients between the ridge structure and the first current blocking layers is reduced, whereby a reliable and long-lived semiconductor laser is realized.

According to a third aspect of the present invention, in the above-mentioned semiconductor laser, the Al composition x of the $Al_xGa_{1-x}As$ first current blocking layers is high at the bottom and gradually reduces toward the surface. Therefore, unwanted absorption of laser light produced in the active layer at both sides of the ridge structure is surely avoided, and a stress applied to the ridge structure is reduced, whereby a reliable and long-lived semiconductor laser with improved laser characteristics is realized.

According to a fourth aspect of the present invention, the above-mentioned semiconductor laser further comprises $Al_yGa_{1-y}As$ layers disposed on the first current blocking layers and having an Al composition y that provides a thermal expansion coefficient equivalent to the thermal expansion coefficient of the cladding layer. Therefore, a stress applied to the ridge structure due to a difference in thermal expansion coefficients between the cladding layer in the ridge and the first current blocking layers is further reduced.

According to a fifth aspect of the present invention, a semiconductor laser comprises a ridge structure; a cladding layer included in the ridge structure; and current blocking structures disposed at both sides of the ridge structure and including AlAs first current blocking layers contacting the ridge structure, and $Al_xGa_{1-x}As$ layers disposed on the first current blocking layers and having a desired Al composition x. Therefore, unwanted change of the Al composition at both sides of the ridge structure is avoided, so that unwanted absorption of laser light produced in the active layer at both sides of the ridge structure is avoided, resulting in a semiconductor laser with improved laser characteristics.

According to a sixth aspect of the present invention, a semiconductor laser comprises a ridge structure; a cladding layer included in the ridge structure; and current blocking structures disposed at both sides of the ridge structure and including $Al_xGa_{1-x}As$ layers contacting the ridge structure and having an Al composition x that is 1 at the bottom and gradually reduces toward the surface. Therefore, unwanted change of the Al composition at both sides of the ridge structure is avoided, so that unwanted absorption of laser light produced in the active layer at both sides of the ridge structure is avoided, resulting in a semiconductor laser with improved laser characteristics.

According to a seventh aspect of the present invention, a semiconductor laser comprises a ridge structure; a cladding layer included in the ridge structure; and current blocking structures disposed at both sides of the ridge structure and including $Al_xGa_{1-x}As$ first current blocking layers contacting the ridge structure, each current blocking layer comprising a plurality of AlAs monomolecular layers and a plurality of GaAs monomolecular layers which are selected to produce a desired Al composition x of the current blocking layer. In this structure, the first current blocking layers have a uniform Al composition, and unwanted change of the Al composition at both sides of the ridge structure is prevented. Therefore, unwanted absorption of laser light produced in the active layer at both sides of the ridge structure is avoided, resulting in a semiconductor laser with improved laser characteristics.

According to an eighth aspect of the present invention, a semiconductor laser comprises a ridge structure; a cladding layer included in the ridge structure; and current blocking structures disposed at both sides of the ridge structure and including first current blocking layers contacting the ridge structure, each current blocking layer comprising a plurality of monomolecular layers, each monomolecular layer comprising a two-element mixed crystal selected from elements that constitute a five-element mixed crystal. In this structure, the first current blocking layers have a uniform composition, and unwanted change of the composition at both sides of the ridge structure is prevented. Therefore, unwanted absorption of laser light produced in the active layer at both sides of the ridge structure is avoided, resulting in a semiconductor laser with improved laser characteristics.

According to a ninth aspect of the present invention, in a method of fabricating a semiconductor laser including growing AlGaAs series current blocking layers at both sides of a ridge structure by MOCVD, the growth process of the current blocking layers comprises the steps of growing first crystalline layers having a good crystallinity at both sides of the ridge structure, at a high temperature exceeding 600° C., and growing second crystalline layers having a poor crystallinity on the first crystalline layers, at a temperature lower than 600° C. The first crystalline layers with a good crystallinity improve the reliability of the device, and the second crystalline layers with a poor crystallinity absorb a stress applied to the ridge structure due to a difference in thermal expansion coefficients between the ridge structure and the current blocking layers. As a result, a reliable and long-lived semiconductor laser with improved laser characteristics is realized.

DETAILED DESCRIPTION OF THE PREFERRED EMBODIMENTS

Figure 1:
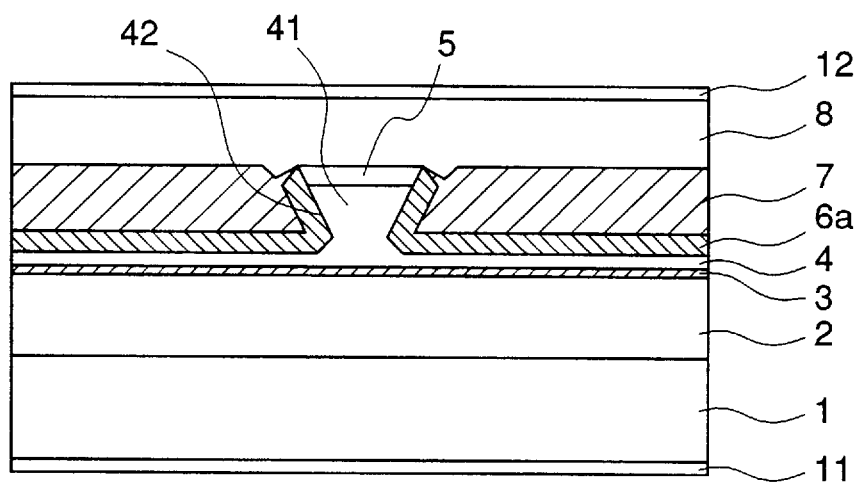
FIG. 1 is a cross-sectional view illustrating a semiconductor laser in accordance with a first embodiment of the present invention.
Figure 13:
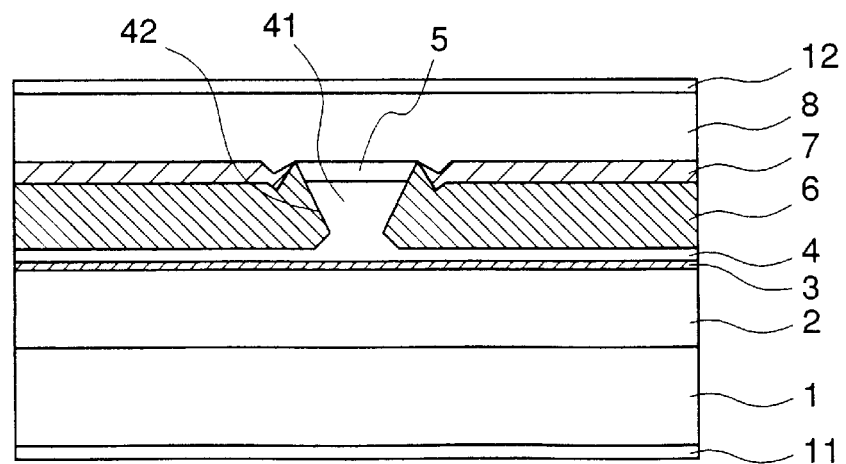
FIG. 13 is a cross-sectional view illustrating a semiconductor laser according to the prior art.

FIG. 1 is a cross-sectional view illustrating a semiconductor laser according to a first embodiment of the present invention. In FIG. 1, the same reference numerals as those shown in FIG. 13 designate the same or corresponding parts. Reference numeral 6a designates n type $Al_{0.75}Ga_{0.25}As$ first current blocking layers.

Figure 14:
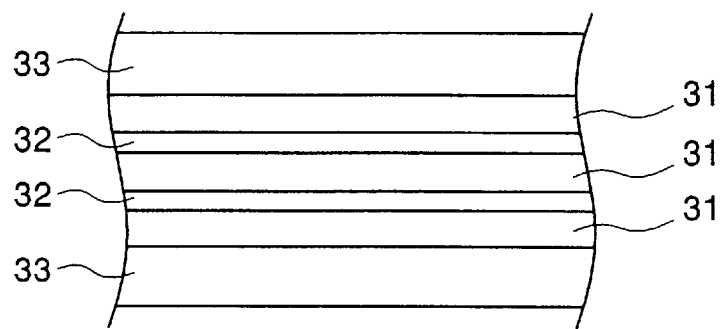
FIG. 14 is an enlarged view of a part of the semiconductor laser shown in FIG. 13.
Figure 15:
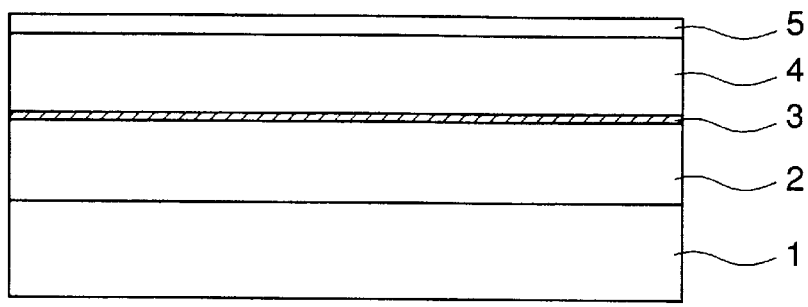
FIGS. 15(a)–15(d) are cross-sectional views illustrating process steps in a method of fabricating the semiconductor laser shown in FIG. 13.
Figure 15:
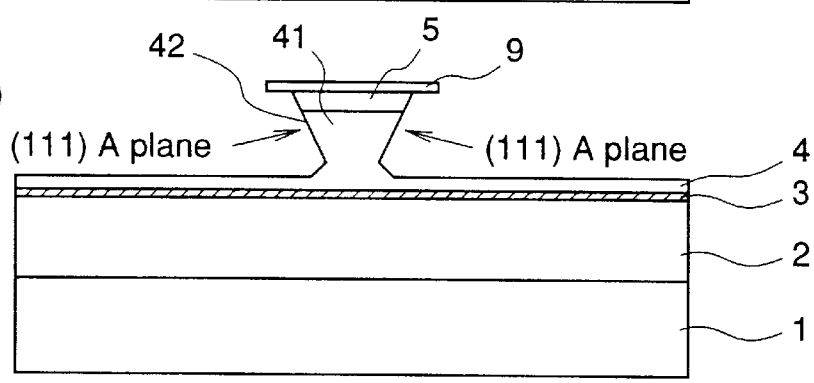
Figure 15:
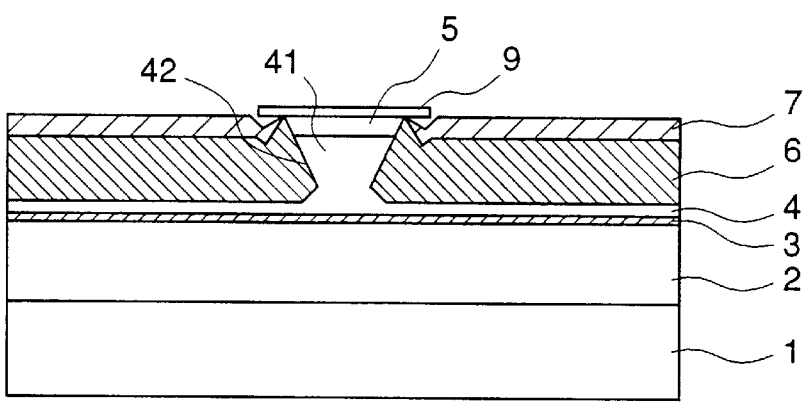
Figure 15:
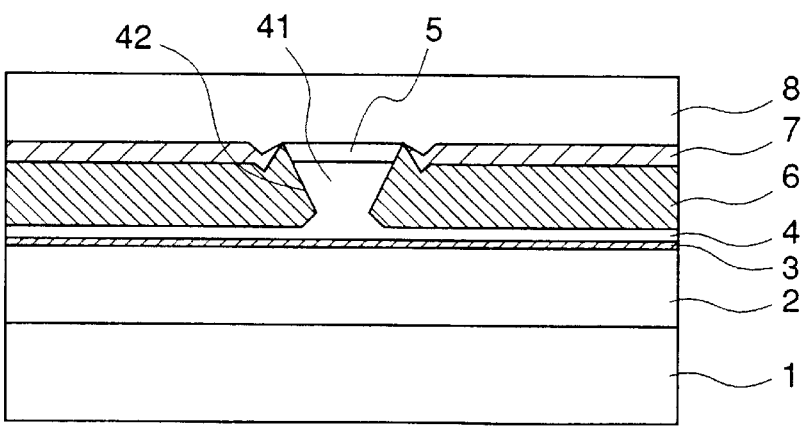
Figure 16:
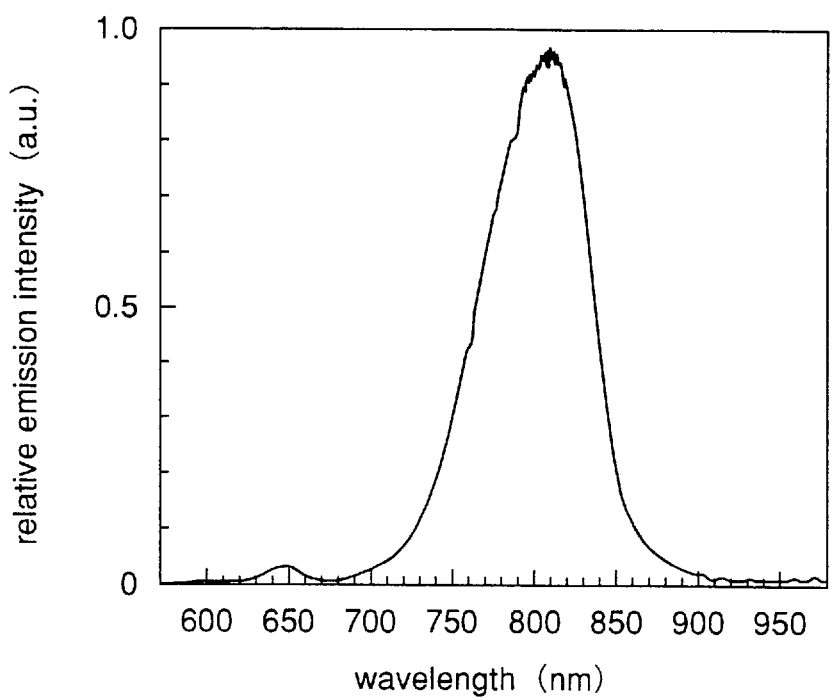
FIG. 16 is a graph showing the room-temperature lasing PL spectrum of AlGaAs current blocking layers at both sides of a ridge structure in the semiconductor laser shown in FIG. 13.

In FIG. 1, the semiconductor laser includes an n type GaAs substrate 1 having a (100) surface orientation. An n type $Al_{0.5}Ga_{0.5}As$ lower cladding layer 2 having a thickness of 1.5 $\mu$m is disposed on the surface of the substrate 1. A TQW active layer 3 having a thickness of 80 nm is disposed on the lower cladding layer 2. As shown in FIG. 14, the TQW active layer 3 comprises three $Al_{0.1}Ga_{0.9}As$ well layers 31 and two $Al_{0.35}Ga_{0.65}As$ barrier layers 32 which are alternatingly laminated, and two $Al_{0.35}Ga_{0.65}As$ guide layers 33 sandwiching the laminated structure of the well layers 31 and the barrier layers 32. This TQW active layer 3 produces laser light having a wavelength of 0.78 $\mu$m. In place of the TQW active layer 3, an $Al_{0.12}Ga_{0.88}As$ active layer 12 nm thick may be employed. A p type $Al_{0.5}Ga_{0.5}As$ upper cladding layer 4 having a thickness of 1.5 $\mu$m is disposed on the TQW active layer 3, and a p type GaAs cap layer 5 having a thickness of 0.5 $\mu$m is disposed on the upper cladding layer 4. The upper cladding layer 4 and the cap layer 5 form a ridge structure 41 having a reverse mesa cross section, in the center of the laser structure. N type $Al_{0.75}Ga_{0.25}As$ first current blocking layers 6a and n type GaAs second current blocking layers 7 are disposed at both sides of the ridge structure 41 so that the ridge structure 41 is buried with these layers 6a and 7. The n type $Al_{0.75}Ga_{0.25}As$ first current blocking layers 6a are as thin as 0.4 $\mu$m on the flat surface of the upper cladding layer 4 and on both sides of the ridge structure 41. The second current blocking layers 7 are 1.4 $\mu$m thick. A p type GaAs contact layer 8 having a thickness of 2 $\mu$m is disposed on the second current blocking layers 7 and on the top of the ridge structure 41. A p side electrode 12 is disposed on the contact layer 8 and an n side electrode 11 is disposed on the rear surface of the n type GaAs substrate 1.

FIGS. 2(a)–2(d) are cross-sectional views illustrating process steps in a method of fabricating the semiconductor laser of FIG. 1.

Initially, the n type $Al_{0.5}Ga_{0.5}As$ lower cladding layer 2, the TQW active layer 3, the p type $Al_{0.5}Ga_{0.5}As$ upper cladding layer 4, and the p type GaAs cap layer 5 are successively grown on the (100) surface of the n type GaAs substrate 1 by MOCVD at a growth temperature of 650° C. (FIG. 2(a)).

Thereafter, an SiN film 9 is deposited on the p type GaAs cap layer 5 by vacuum evaporation and patterned in a stripe in the <011> direction by photolithography and etching. Using the SiN film 9 as a mask, the p type GaAs cap layer 5 and the p type $Al_{0.5}Ga_{0.5}As$ upper cladding layer 4 are wet etched to form the ridge structure 41 (FIG. 2(b)).

Figure 2:
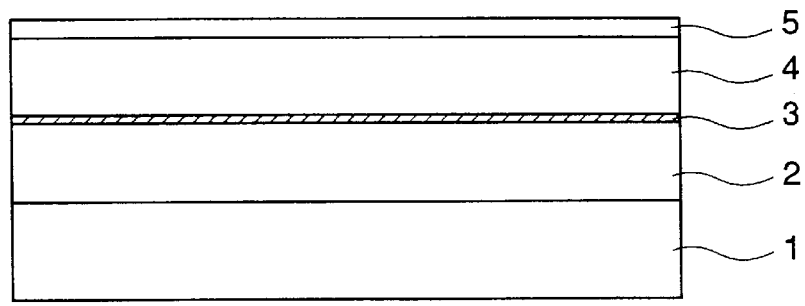
FIGS. 2(a)–2(d) are cross-sectional views illustrating process steps in a method of fabricating the semiconductor laser according to the first embodiment.
Figure 2:
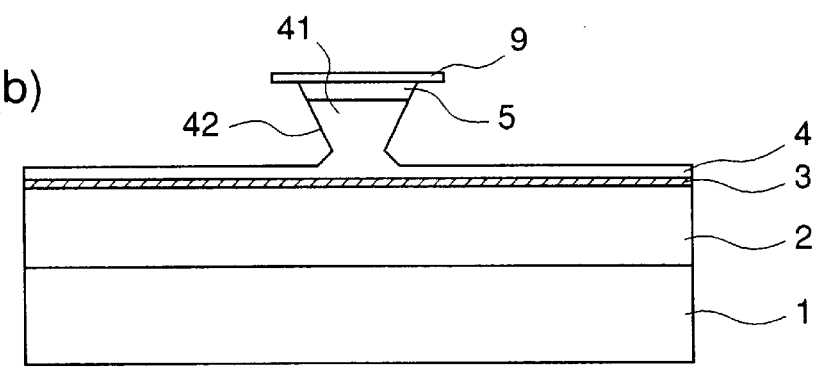
Figure 2:
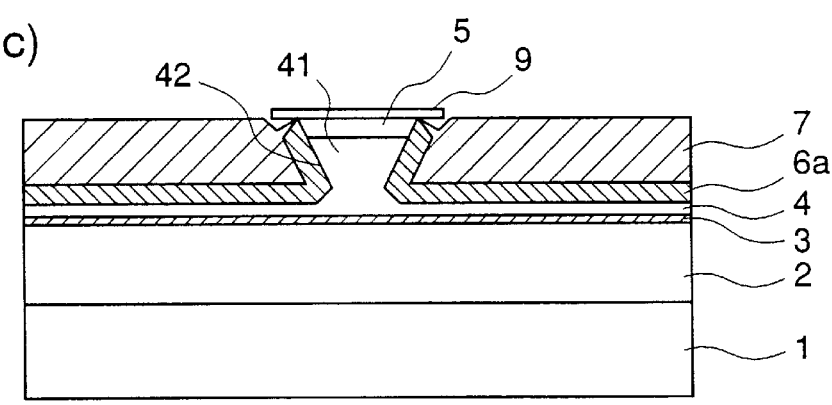
Figure 2:
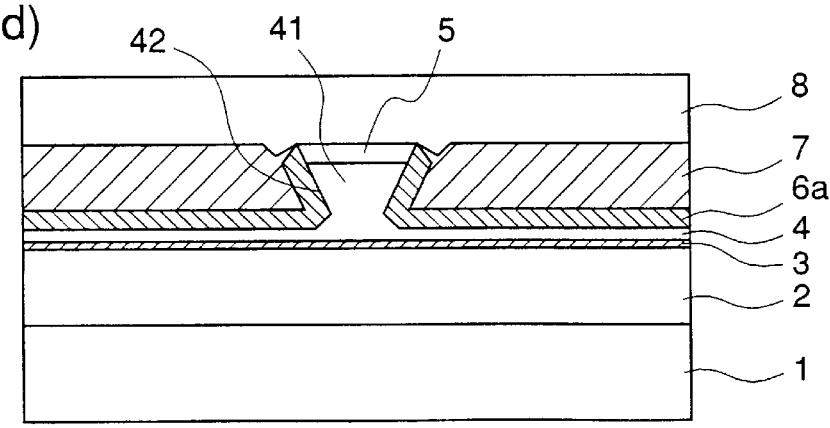

In the step of FIG. 2(c), using the SiN film 9 as a mask, the n type $Al_{0.75}Ga_{0.25}As$ first current blocking layers 6a and the n type GaAs second current blocking layers 7 are successively grown on the upper cladding layer 4 at both sides of the ridge structure 41 by MOCVD at a growth temperature of 650° C. The n type $Al_{0.75}Ga_{0.25}As$ first current blocking layers 6a having a high Al composition, 0.75, can be easily grown by HCl-assisted MOCVD.

After removal of the SiN film 9, the p type GaAs contact layer 8 is grown over the entire surface by MOCVD at a growth temperature of 650° C. (FIG. 2(d)). Finally, the n side electrode 11 and the p side electrode 12 are produced on the rear surface of the substrate 1 and the contact layer 8, respectively, preferably by vacuum evaporation, to complete the laser structure shown in FIG. 1.

A description is given of the operation of the semiconductor laser.

When a forward bias voltage is applied across the p side electrode 12 and the n side electrode 11, electrons are injected into the TQW active layer 3 through the n type GaAs substrate 1 and the n type $Al_{0.5}Ga_{0.5}As$ lower cladding layer 2, and holes are injected into the TQW active layer 3 through the p type GaAs contact layer 8, the p type GaAs cap layer 5, and the p type $Al_{0.5}Ga_{0.5}As$ upper cladding layer 4. In the TQW active layer 3, electrons and holes recombine to generate induced light. When the quantity of the injected carriers, i.e., electrons and holes, is sufficient to produce light exceeding the light lost in the waveguide, laser oscillation occurs.

In the semiconductor laser according to this first embodiment of the invention, since the Al composition of the n type $Al_{0.75}Ga_{0.25}As$ first current blocking layers 6a is larger than the Al composition of the p type $Al_{0.5}Ga_{0.5}As$ upper cladding layer 4, the refractive index of the p type $Al_{0.5}Ga_{0.5}As$ upper cladding layer 4 is larger than the refractive index of the n type $Al_{0.75}Ga_{0.25}As$ first current blocking layers 6a. Therefore, laser light generated in the TQW active layer 3 is guided in the ridge structure 41 including the p type $Al_{0.5}Ga_{0.5}As$ upper cladding layer 4 having such a large refractive index.

Figure 3:
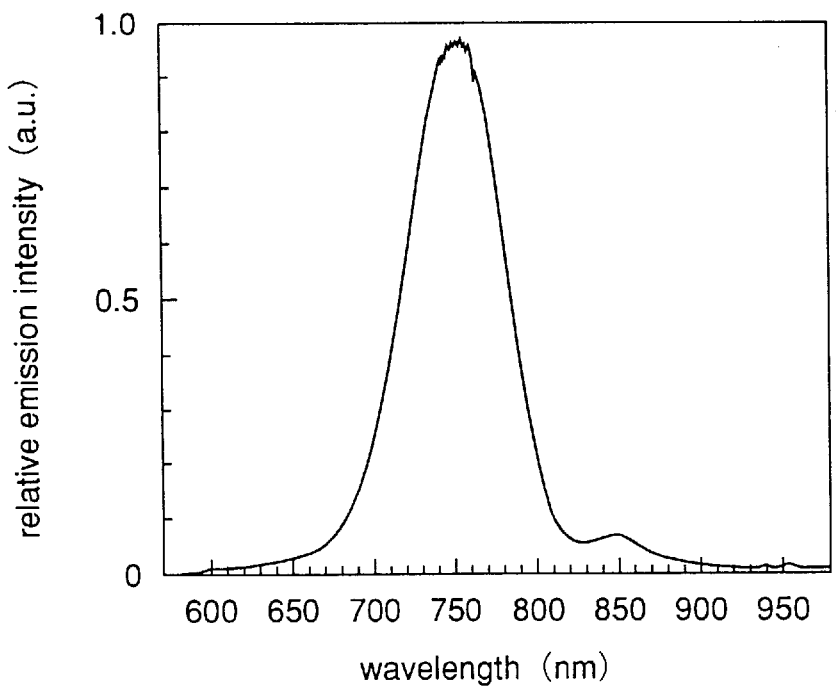
FIG. 3 is a graph showing the room-temperature lasing PL spectrum of AlGaAs current blocking layers at both sides of a ridge structure in the semiconductor laser according to the first embodiment.

FIG. 3 is a graph illustrating a PL spectrum of the n type $Al_{0.75}Ga_{0.25}As$ first current blocking layers 6 at both sides of the ridge structure 41, at room temperature (about 25° C.). As shown in FIG. 3, the PL spectrum has a peak at about 750 nm, and this is shorter than the wavelength, 780 nm, of laser light produced in the TQW active layer 3. From this fact, it is found that laser light produced in the TQW active layer 3 is not absorbed by the first current blocking layers 6a at both sides of the ridge structure 41.

That is, in the semiconductor laser according to this first embodiment, although the side surfaces 42 of the ridge 41, which is formed by wet etching, are (1ll)A planes, since the Al composition of the n type $Al_{0.75}Ga_{0.25}As$ first current blocking layers 6a is larger than the Al composition of the $Al_{0.7}Ga_{0.3}As$ first current blocking layers 6 of the prior art laser, even when the Al composition of the first current blocking layers 6a is reduced adjacent to the side surfaces 42 of the ridge 41, the wavelength of the first current blocking layers 6a does not become longer than the wavelength of laser light produced in the TQW active layer 3, so that light produced in the TQW active layer 3 is not absorbed at both sides of the ridge structure 41, whereby unwanted degradation of the laser characteristics is avoided.

Furthermore, since the n type $Al_{0.75}Ga_{0.25}As$ first current blocking layers 6a having a thermal expansion coefficient considerably different from that of the ridge structure 41 are as thin as 0.4 μm, whereas the n type $Al_{0.7}Ga_{0.3}As$ first current blocking layers 6 of the prior art laser are 1.3 μm thick, the stress applied to the ridge 41 due to the difference in thermal expansion coefficients between the ridge 41 and the first current blocking layers 6a is reduced, resulting in a highly reliable and long-lived semiconductor laser.

[Embodiment 2]

Figure 4:
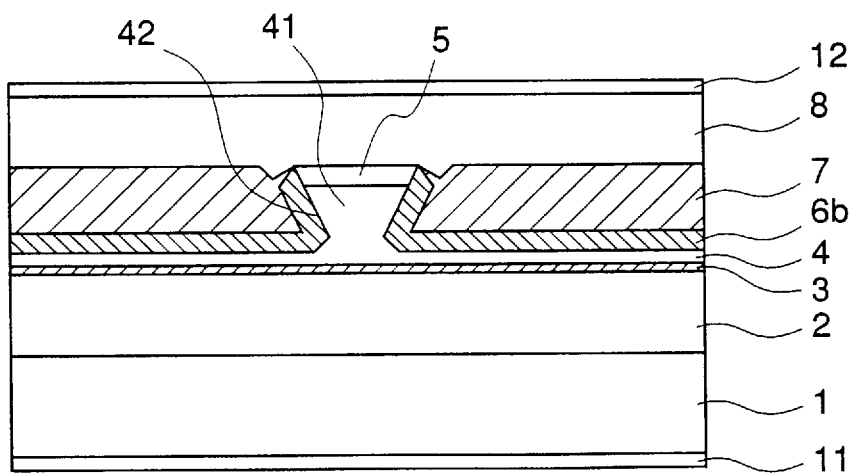
FIG. 4 is a cross-sectional view illustrating a semiconductor laser in accordance with a second embodiment of the present invention.

FIG. 4 is a cross-sectional view illustrating a semiconductor laser according to a second embodiment of the present invention. In FIG. 4, the same reference numerals as those shown in FIG. 1 designate the same or corresponding parts. The laser structure according to this second embodiment is fundamentally identical to the laser structure according to the first embodiment except that n type $Al_xGa_{1-x}As$ first current blocking layers 6b in which the Al composition x is 0.8 at the bottom and gradually decreases toward the surface from 0.8 to 0.7, are employed in place of the n type $Al_{0.75}Ga_{0.25}As$ first current blocking layers 6a.

The process steps for fabricating the semiconductor laser according to this second embodiment are identical to those already described with respect to FIGS. 2(a)–2(d) except that the n type $Al_xGa_{1-x}As$ first current blocking layers 6b are grown by appropriately controlling the flow rate of Al or Ga so that the Al composition x gradually decreases toward the surface from 0.8 to 0.7.

In this second embodiment of the present invention, since the ridge structure 41 is between the n type $Al_xGa_{1-x}As$ first current blocking layers 6b having an Al composition larger than that of the n type $Al_{0.75}Ga_{0.25}As$ first current blocking layers 6a according to the first embodiment, unwanted absorption of laser light produced in the TQW active layer 3 at both sides of the ridge structure 41 is surely prevented. Further, since the Al composition of the n type $Al_xGa_{1-x}As$ first current blocking layers 6b gradually decreases toward the surface, the stress applied to the ridge structure 41 due to the difference in thermal expansion coefficients between the p type $Al_{0.5}Ga_{0.5}As$ upper cladding layer 4 in the ridge 41 and the n type $Al_xGa_{1-x}As$ first current blocking layers 6b is further reduced.

[Embodiment 3]

Figure 5:
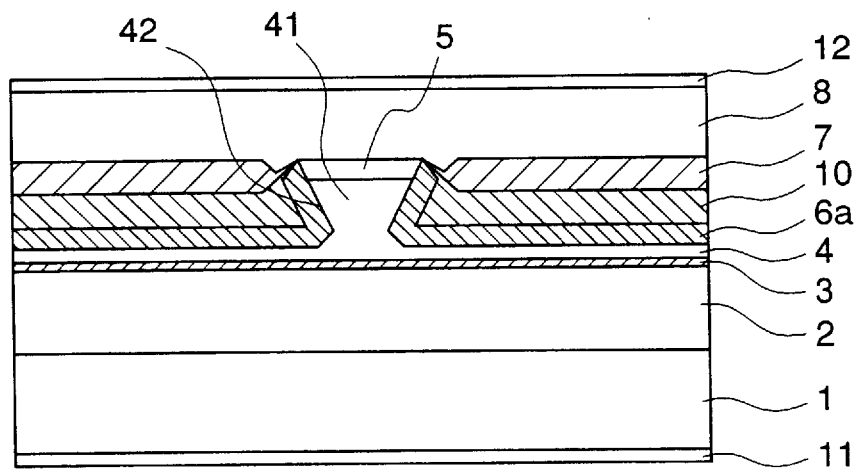
FIG. 5 is a cross-sectional view illustrating a semiconductor laser in accordance with a third embodiment of the present invention.

FIG. 5 is a cross-sectional view illustrating a semiconductor laser in accordance with a third embodiment of the present invention. In the figure, the same reference numerals as those shown in FIG. 1 designate the same or corresponding parts.

The semiconductor laser according to this third embodiment is identical to the semiconductor laser according to the first embodiment except that, at both sides of the ridge structure 41, n type $Al_{0.5}Ga_{0.5}As$ third current blocking layers 10 are interposed between the n type $Al_{0.75}Ga_{0.25}As$ first current blocking layers 6a and the n type GaAs second current blocking layers 7. The n type $Al_{0.75}Ga_{0.25}As$ first current blocking layers 6a are 0.4 μm thick, the n type GaAs second current blocking layers 7 are 0.5 μm thick, and the n type $Al_{0.5}Ga_{0.5}As$ third current blocking layers 10 are 0.9 μm thick.

The process steps of making the laser structure shown in FIG. 5 are identical to those already described with respect to FIGS. 2(a)–2(d) except that, in the step of FIG. 2(c), the n type $Al_{0.5}Ga_{0.5}As$ third current blocking layers 10 are grown on the n type $Al_{0.75}Ga_{0.25}As$ first current blocking layers 6a and, thereafter, the n type GaAs second current blocking layers 7 are grown on the third current blocking layers 10.

In this third embodiment of the invention, since the Al composition of the n type $Al_{0.5}Ga_{0.5}As$ third current blocking layers 10 in the middle of the current blocking structure is the same as the Al composition of the p type $Al_{0.5}Ga_{0.5}As$ upper cladding layer 4 in the ridge structure 41, there is no difference in thermal expansion coefficients between the p type $Al_{0.5}Ga_{0.5}As$ upper cladding layer 4 and the n type $Al_{0.5}Ga_{0.5}As$ third current blocking layers 10. Therefore, the stress applied to the ridge structure 41 due to the difference in thermal expansion coefficients between the p type $Al_{0.5}Ga_{0.5}As$ upper cladding layer 4 and the n type $Al_{0.75}Ga_{0.25}As$ first current blocking layers 6a is further reduced.

[Embodiment 4]

Figure 6:
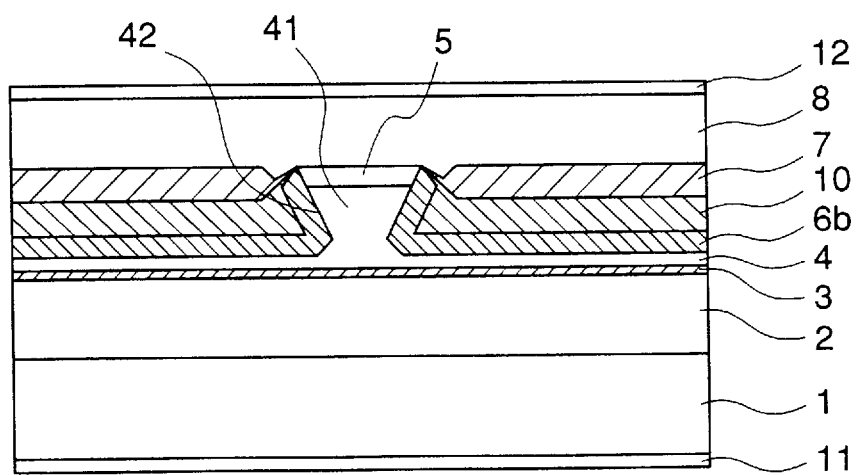
FIG. 6 is a cross-sectional view illustrating a semiconductor laser in accordance with a fourth embodiment of the present invention.

FIG. 6 is a cross-sectional view illustrating a semiconductor laser in accordance with a fourth embodiment of the present invention. In the figure, the same reference numerals as those shown in FIG. 5 designate the same or corresponding parts. The semiconductor laser according to this fourth embodiment is identical to the semiconductor laser according to the third embodiment except that n type $Al_xGa_{1-x}As$ first current blocking layers 6b in which the Al composition x is 0.8 at the bottom and gradually decreases toward the surface from 0.8 to 0.7, are employed in place of the n type $Al_{0.75}Ga_{0.25}As$ first current blocking layers 6a.

The process steps for fabricating the semiconductor laser according to this fourth embodiment are identical to those already described for the third embodiment except that the n type $Al_xGa_{1-x}As$ first current blocking layers 6b are grown by appropriately controlling the flow rate of Al or Ga so that the Al composition x gradually decreases toward the surface from 0.8 to 0.7.

In this fourth embodiment of the invention, since the ridge structure 41 is between the n type $Al_xGa_{1-x}As$ first current blocking layers 6b having a high Al composition, unwanted absorption of light produced in the TQW active layer 3 at both sides of the ridge structure 41 is effectively prevented. Further, since the Al composition of the n type $Al_xGa_{1-x}As$ first current blocking layers 6b gradually decreases toward the surface, the stress applied to the ridge structure 41 due to the difference in thermal expansion coefficients between the p type $Al_{0.5}Ga_{0.5}As$ upper cladding layer 4 in the ridge 41 and the n type $Al_xGa_{1-x}As$ first current blocking layers 6b is reduced.

[Embodiment 5]

Figure 7:
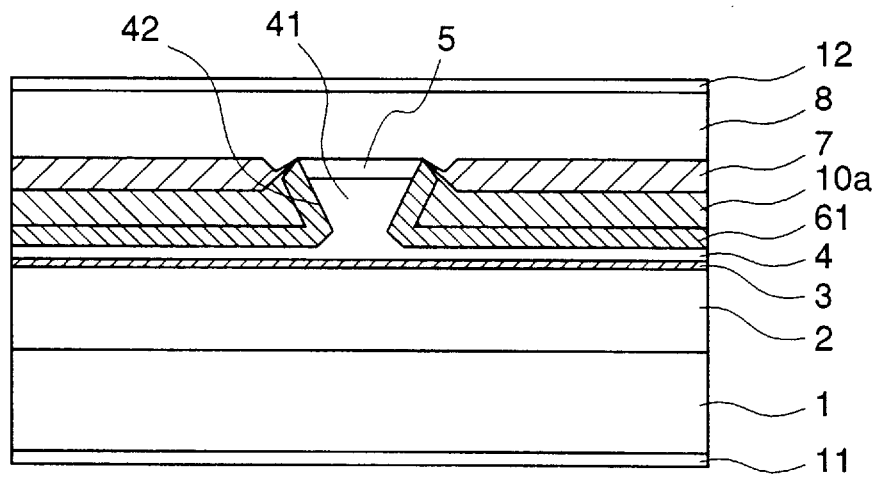
FIG. 7 is a cross-sectional view illustrating a semiconductor laser in accordance with a fifth embodiment of the present invention.

FIG. 7 is a cross-sectional view illustrating a semiconductor laser in accordance with a fifth embodiment of the present invention. In FIG. 7, the same reference numerals as those shown in FIG. 5 designate the same or corresponding parts.

The semiconductor laser according to this fifth embodiment is identical to the semiconductor laser according to the third embodiment except that n type AlAs first current blocking layers 61 comprising a two-element mixed crystal, AlAs, are employed in place of the n type $Al_{0.75}Ga_{0.25}As$ first current blocking layers 6a, and n type $Al_{0.7}Ga_{0.3}As$ third current blocking layers 10a are employed in place of the n type $Al_{0.5}Ga_{0.5}As$ third current blocking layers 10. The n type GaAs second current blocking layers 7 are disposed on the n type $Al_{0.7}Ga_{0.3}As$ third current blocking layers 10a. The n type AlAs first current blocking layers 61 are 0.4 μm thick, the n type GaAs second current blocking layers 7 are 0.5 μm thick, and the n type $Al_{0.7}Ga_{0.3}As$ third current blocking layers 10a are 0.9 μm thick.

In this fifth embodiment of the invention, since the ridge structure 41 is between the n type AlAs first current blocking layers 61, an unwanted change in the Al composition at both sides of the ridge structure 41 is reliably prevented, whereby unwanted absorption of laser light at both sides of the ridge structure 41 is avoided, resulting in a semiconductor laser with improved laser characteristics.

[Embodiment 6]

Figure 8:
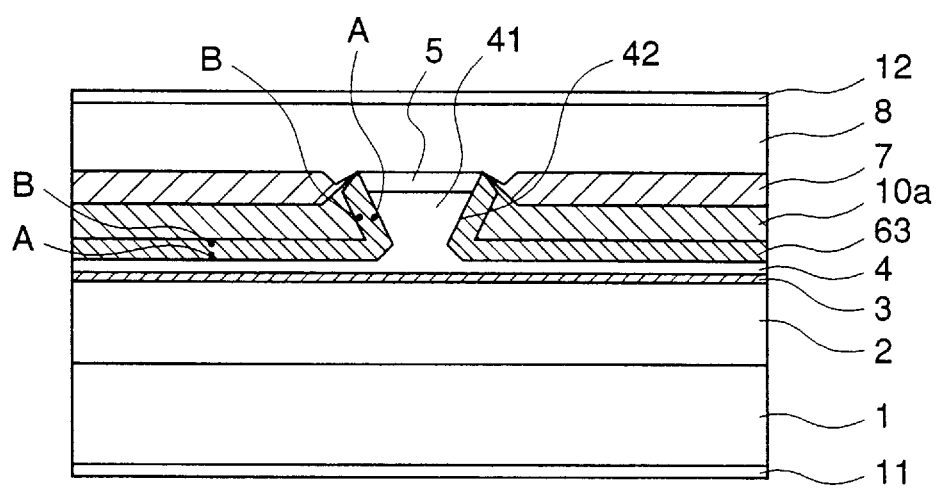
FIG. 8 is a cross-sectional view illustrating a semiconductor laser in accordance with a sixth embodiment of the present invention.

FIG. 8 is a cross-sectional view illustrating a semiconductor laser in accordance with a sixth embodiment of the present invention. In the figure, the same reference numerals as those shown in FIG. 7 designate the same or corresponding parts.

The semiconductor laser according to this sixth embodiment is identical to the semiconductor laser according to the fifth embodiment except that n type $Al_xGa_{1-x}As$ first current blocking layers 63, in which the Al composition x is 1 at the bottom and gradually decreases toward the surface from 1 to 0.7, are employed in place of the n type AlAs first current blocking layers 61. That is, in FIG. 8, the Al composition of the n type $Al_xGa_{1-x}As$ first current blocking layers 63 is 1 at the points A and 0.7 at the points B.

In this sixth embodiment of the present invention, since the ridge structure 41 is between the n type $Al_xGa_{1-x}As$ first current blocking layers 63 wherein the Al composition x gradually decreases toward the surface from 1 to 0.7, an unwanted change of the Al composition at both sides of the ridge structure 41 is reliably prevented, whereby unwanted absorption of laser light at both sides of the ridge structure 41 is avoided, resulting in a semiconductor laser with improved characteristics.

Although in this sixth embodiment the Al composition x of the n type $Al_xGa_{1-x}As$ first current blocking layers 63 is decreased to 0.7 at the surface, the Al composition at the surface is not restricted thereto. That is, the Al composition may be decreased to a desired value, for example, 0.8.

[Embodiment 7]

Figure 9:
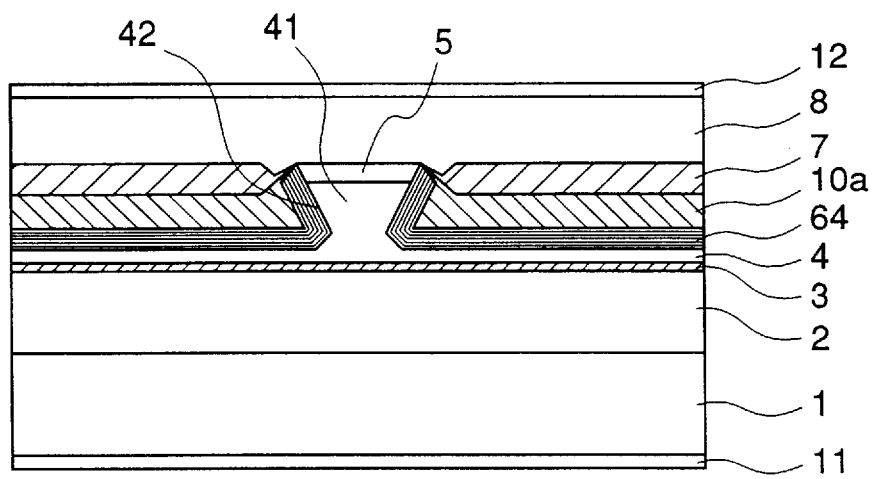
FIGS. 9(a) and 9(b) are cross-sectional views illustrating a semiconductor laser in accordance with a seventh embodiment of the present invention.
Figure 9:
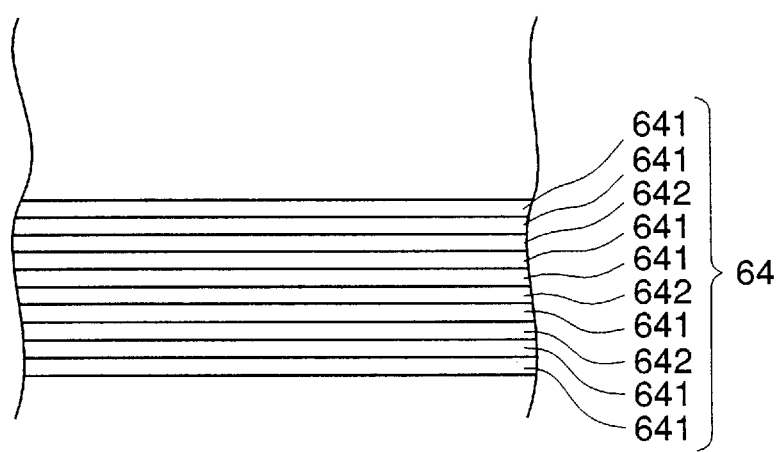

FIG. 9(a) is a cross-sectional view illustrating a semiconductor laser in accordance with a seventh embodiment of the present invention, and FIG. 9(b) is an enlarged view of a part of the semiconductor laser.

The semiconductor laser according to this seventh embodiment is identical to the semiconductor laser according to the fifth embodiment shown in FIG. 7 except that n type $Al_{0.7}Ga_{0.3}As$ first current blocking layers 64, each comprising seven monomolecular AlAs layers 641 and three monomolecular GaAs layers 642 which are appropriately laminated, are employed in place of the n type AlAs first current blocking layers 61.

That is, as shown in FIG. 9(b), the n type $Al_{0.7}Ga_{0.3}As$ first current blocking layer 64 is fabricated by growing seven monomolecular AlAs layers 641 and three monomolecular GaAs layers 642 so that the Al composition becomes uniform throughout the layer 64. In the growth process, for example, two AlAs layers 641, one GaAs layer 642, one AlAs layer 641, one GaAs layer 642, two AlAs layers 641, one GaAs layer 642, and two AlAs layers 641 are successively grown in this order to a desired thickness.

Figure 10:
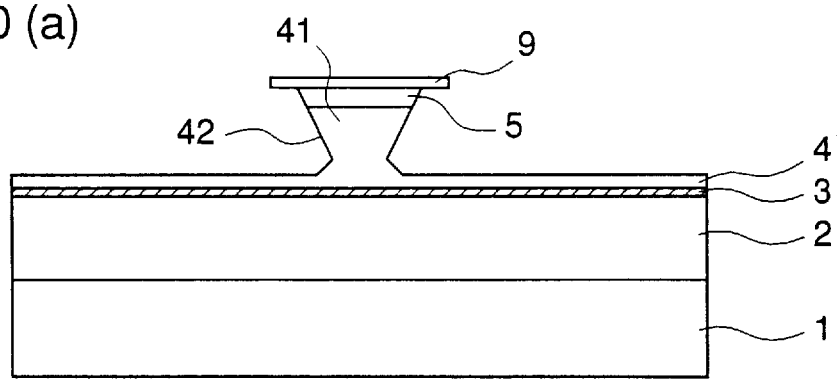
FIGS. 10(a) and 10(b) are cross-sectional views illustrating process steps in a method of fabricating the semiconductor laser according to the seventh embodiment.
Figure 10:
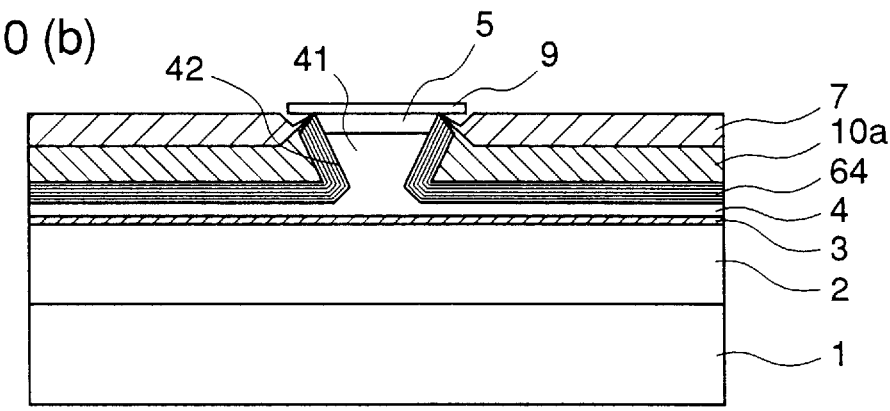

FIGS. 10(a) and 10(c) are cross-sectional views illustrating process steps in a method of fabricating the semiconductor laser shown in FIG. 9(a).

Initially, the n type $Al_{0.5}Ga_{0.5}As$ lower cladding layer 2, the TQW active layer 3, the p type $Al_{0.5}Ga_{0.5}As$ upper cladding layer 4, and the p type GaAs cap layer 5 are successively grown on the n type GaAs substrate 1 by MOCVD and, thereafter, the cap layer 5 and the upper cladding layer 4 are wet etched using an SiN film 9 as a mask so that the etching front stops within the upper cladding layer 4, thereby producing a reverse mesa-shaped ridge structure 41 (FIG. 10(a)).

In the step of FIG. 10(b), using the SiN film 9 as a mask, seven AlAs layers 641 and three GaAs layers 642 are grown at both sides of the ridge structure 41, thereby producing the n type $Al_{0.7}Ga_{0.3}As$ first current blocking layers 64.

Thereafter, the n type $Al_{0.7}Ga_{0.3}As$ third current blocking layers 10a and the n type GaAs second current blocking layers 7 are successively grown on the n type $Al_{0.7}Ga_{0.3}As$ first current blocking layers 64 by MOCVD. After removal of the SiN film 9, the p type GaAs contact layer 8 is grown over the entire surface. Finally, the n side electrode 11 and the p side electrode 12 are fabricated, by vacuum evaporation, on the rear surface of the n type GaAs substrate 1 and the p type GaAs contact layer 8, respectively, thereby completing the semiconductor laser shown in FIG. 9.

In the semiconductor laser thus fabricated, the n type $Al_{0.7}Ga_{0.3}As$ first current blocking layers 64 comprising the monomolecular AlAs layers 641 and the monomolecular GaAs layers 642 have a uniform Al composition, so the ridge structure 11 is between the n type $Al_{0.7}Ga_{0.3}As$ first current blocking layers 64. Therefore, an unwanted change of the Al composition at both sides of the ridge structure 11 is prevented, whereby unwanted absorption of laser light at both sides of the ridge structure 11 is avoided, resulting in a semiconductor laser with improved characteristics.

Although the Al composition x of the n type $Al_xGa_{1-x}As$ first current blocking layers 64 is 0.7 in this seventh embodiment, the Al composition x is not restricted thereto and may be changed by appropriately changing the ratio of the monomolecular AlAs layers 641 to the monomolecular GaAs layers 642 in the first current blocking layers 64.

[Embodiment 8]

Figure 11:
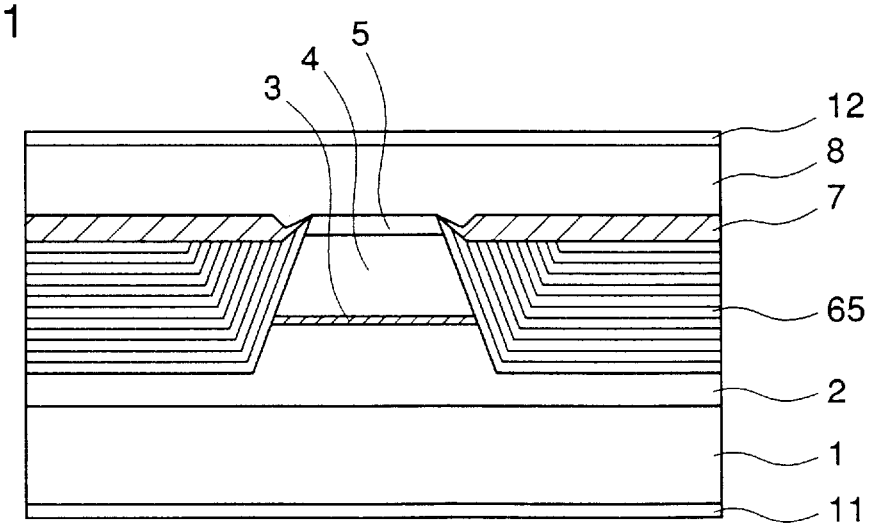
FIG. 11 is a cross-sectional view illustrating a semiconductor laser in accordance with an eighth embodiment of the present invention.

FIG. 11 is a cross-sectional view illustrating a semiconductor laser in accordance with an eighth embodiment of the present invention. In the figure, the same reference numerals as those shown in FIG. 1 designate the same or corresponding parts.

In the semiconductor laser according to this eighth embodiment, a ridge structure comprises the lower cladding layer 2, the active layer 3, the upper cladding layer 4, and the cap layer 5. First current blocking layers 65 comprising an n-element mixed crystal (n: an integer, $3 \leq n \leq 5$) are disposed at both sides of the ridge structure. More specifically, in the first current blocking layers 65, monomolecular layers comprising different two-element mixed crystals selected from two-element mixed crystals from combinations of five elements, for example, AlP, InP, GaP, AlAs, InAs, and GaAs, are appropriately laminated to produce a desired composition ratio. Further, n type GaAs second current blocking layers 7 are disposed on the first current blocking layers 65.

When first current blocking layers comprising a three-element mixed crystal, AlGaAs, are desired, AlAs and GaAs are selected. In order to make the AlGaAs current blocking layers have a composition ratio of $Al_{0.7}Ga_{0.3}As$, seven monomolecular AlAs layers and three monomolecular GaAs layers are grown in the order as described for the n type $Al_{0.7}Ga_{0.3}As$ layers 64 according to the seventh embodiment.

As described above, the first current blocking layers 65 comprising an n-element mixed crystal having a desired composition ratio are realized by selecting appropriate two-element mixed crystals from the group consisting of, for example, AlP, InP, GaP, AlAs, InAs, and GaAs.

Figure 12:
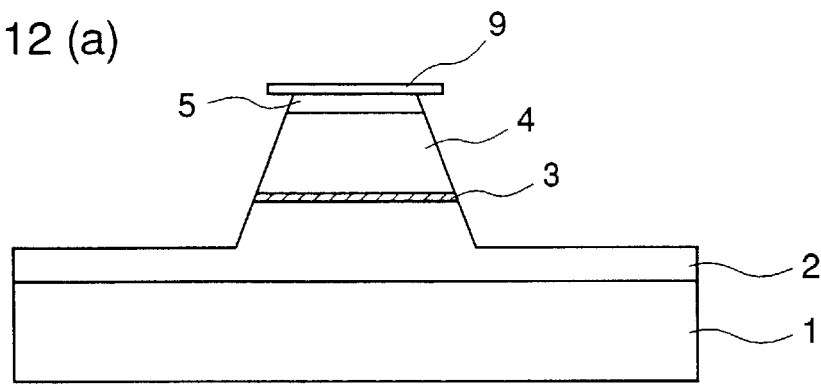
FIGS. 12(a) and 12(b) are cross-sectional views illustrating process steps in a method of fabricating the semiconductor laser according to the eighth embodiment.
Figure 12:
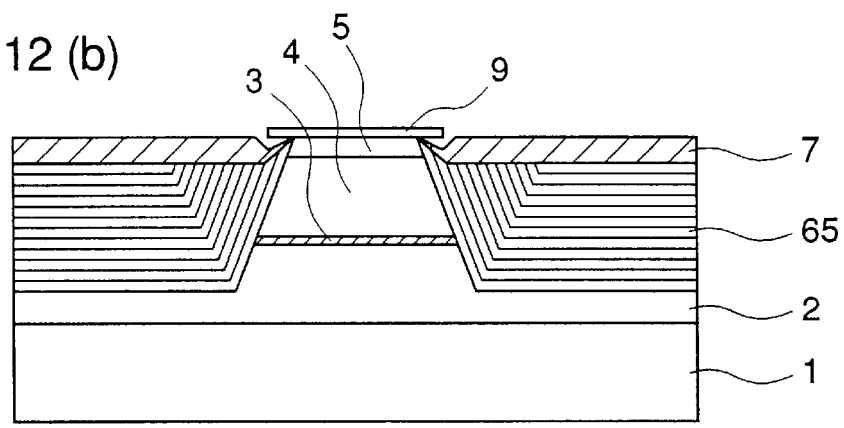

FIGS. 12(a) and 12(b) are cross-sectional views illustrating process steps in a method of fabricating the semiconductor laser shown in FIG. 11.

Initially, the n type $Al_{0.5}Ga_{0.5}As$ lower cladding layer 2, the TQW active layer 3, the p type $Al_{0.5}Ga_{0.5}As$ upper cladding layer 4, and the p type GaAs cap layer 5 are successively grown on the n type GaAs substrate 1 by MOCVD and, thereafter, the cap layer 5, the upper cladding layer 4, the active layer 3, and the lower cladding layer 2 are wet etched using an SiN film 9 as a mask so that the etching front stops within the lower cladding layer 2, thereby producing a ridge structure having a forward mesa cross section (FIG. 12(a)).

In the step of FIG. 12(b), using the SiN film 9 as a mask, the first current blocking layers 65 comprising an n-element mixed crystal and having a desired composition ratio are produced at both sides of the ridge by growing monomolecular layers comprising different two-element mixed crystals selected from the two-element mixed crystals that may be produced from combinations of five elements. Thereafter, the n type GaAs second current blocking layers 7 are grown on the first current blocking layers 65. After removal of the SiN film 9, the p type GaAs contact layer 8 is grown over the entire surface. Finally, the n side electrode 11 and the p side electrode 12 are fabricated, by vacuum evaporation, on the rear surface of the n type GaAs substrate 1 and the p type GaAs contact layer 8, respectively, to complete the semiconductor laser shown in FIG. 11.

In the semiconductor laser thus fabricated, since the ridge structure is between the first current blocking layers 65 having a uniform composition ratio, an unwanted change of the Al composition at both sides of the ridge is reliably prevented, so that unwanted absorption of laser light is avoided, resulting in a semiconductor laser with improved laser characteristics.

[Embodiment 9]

A ninth embodiment of the present invention relates to a method of fabricating a semiconductor laser including a step of growing current blocking layers at both sides of a ridge structure by MOCVD. The MOCVD growth comprises a first step of growing a high quality crystalline layer at a temperature exceeding 600° C. and a second step of growing a low quality crystalline layer at a temperature lower than 600° C.

For example, when this growth method is applied to the fabrication of the semiconductor laser according to the first embodiment, in the step of FIG. 2(c), the n type $Al_{0.75}Ga_{0.25}As$ first current blocking layers 6a are grown at 700° C., and the n type GaAs second current blocking layers 7 are grown at 550° C.

In the current blocking structures thus produced, the n type $Al_{0.75}Ga_{0.25}As$ first current blocking layers 6a in the vicinity of the active layer 3 have good crystallinity while the n type GaAs second current blocking layers 7 distant from the active layer 3 include a lot of defects, such as dislocations, and have poor crystallinity. Therefore, the n type $Al_{0.75}Ga_{0.25}As$ first current blocking layers 6a with good crystallinity improve the reliability of the device, and the n type GaAs second current blocking layers 7 with poor crystallinity absorb a stress applied to the ridge structure 41 due to a difference in thermal expansion coefficients between the p type $Al_{0.5}Ga_{0.5}As$ upper cladding layer 4 and the n type $Al_{0.75}Ga_{0.25}As$ first current blocking layers 6a.

In the first to fourth and sixth to ninth embodiments of the invention, the Al composition x of the n type $Al_xGa_{1-x}As$ first current blocking layers is not restricted to those described for these embodiments. The Al composition x may be varied as long as it is larger than 0.7.

While the thickness of the n type $Al_xGa_{1-x}As$ first current blocking layers is 0.4 in the fifth to seventh embodiments of the invention, the thickness is not restricted thereto and may be varied as long as it is thinner than 0.7 μm. However, since the Al concentration in the current blocking layers at both sides of the ridge structure decreases with a reduction in the thickness of the current blocking layers, that thickness should not be too thin. Preferably, the thickness is in a range from 0.2–0.5 μm.

While the Al composition of the AlGaAs upper and lower cladding layers 4 and 2 is 0.5 in the first to ninth embodiments of the invention, the Al composition is not restricted thereto and may be changed as long as it is lower than 0.7. Further, in place of AlGaAs, InGaP may be employed for the upper and lower cladding layers. In this case, since the thermal expansion coefficient of InGaP, $5.33 \times 10^{-6}$/K, is equivalent to the thermal expansion coefficient of $Al_{0.3}Ga_{0.7}As$, the Al composition x of the $Al_xGa_{1-x}As$ third current blocking layers 10 in the third and fourth embodiments must be 0.3.

Furthermore, in the first to fourth embodiments of the invention, the thicknesses of the layers other than the n type AlGaAs first current blocking layers may be changed as desired. In addition, in the fifth to eighth embodiments of the invention, the thicknesses of the respective layers including the first current blocking layers may be changed as desired.

What is claimed is:

1. In a semiconductor laser comprising:
   an active layer and a cladding layer disposed on the active layer, the cladding layer including a generally planar portion and a ridge portion;
   a cap layer disposed on the ridge portion of the cladding layer, the cap layer and ridge portion comprising a ridge structure, the ridge structure projecting away from the active layer with the generally planar portion of the cladding layer disposed between the active layer and the ridge structure, the ridge structure having side surfaces; and
   current blocking structures disposed at both sides of the ridge structure and including:
      $Al_xGa_{1-x}As$ first current blocking layers having an Al composition x larger than 0.7 and less than 1.0, covering the generally planar portion of the cladding layer and the side surfaces of the ridge structure, and having a thickness on the side surfaces of the ridge structure and on the generally planar portion of the cladding layer of less than 0.7 μm, and
      GaAs second current blocking layers disposed on and contacting the first current blocking layers at both sides of the ridge structure.

2. The semiconductor laser of claim 1 wherein the Al composition x of the $Al_xGa_{1-x}As$ first current blocking layers gradually decreases toward interfaces of the first and second current blocking layers.

3. In a semiconductor laser comprising:
   an active layer and a cladding layer having a thermal expansion coefficient and disposed on the active layer, the cladding layer including a generally planar portion and a ridge portion;
   a cap layer disposed on the ridge portion of the cladding layer, the cap layer and ridge portion comprising a ridge structure, the ridge structure projecting away from the active layer with the generally planar portion of the cladding layer disposed between the active layer and the ridge structure, the ridge structure having side surfaces; and
   current blocking structures disposed at both sides of the ridge structure and including:
      $Al_xGa_{1-x}As$ first current blocking layers having an Al composition x larger than 0.7 and covering the generally planar portion of the cladding layer and the side surfaces of the ridge structure,
      GaAs second current blocking layers disposed on and contacting the first current blocking layers at both sides of the ridge structure, and
      $Al_yGa_{1-x}As$ third current blocking layers disposed between the first and second current blocking layers and having an Al composition y that produces a thermal expansion coefficient equivalent to the thermal expansion coefficient of the cladding layer.

4. In a semiconductor laser comprising:
   an active layer and a cladding layer disposed on the active layer, the cladding layer including a generally planar portion and a ridge portion;
   a cap layer disposed on the ridge portion of the cladding layer, the cap layer and ridge portion comprising a ridge structure, the ridge structure projecting away from the active layer with the generally planar portion of the cladding layer disposed between the active layer and the ridge structure, the ridge structure having side surfaces; and
   current blocking structures disposed at both sides of the ridge structure and including:
      AlAs first current blocking layers covering the generally planar portion of the cladding layer and the side surfaces of the ridge structure,
      $Al_xGa_{1-x}As$ second current blocking layers disposed on the first current blocking layers at both sides of the ridge structure, and
      $Al_yGa_{1-y}As$ third current blocking layers interposed between and contacting the first and second current blocking layers, where y is not equal to x.

5. In a semiconductor laser comprising:
   an active layer and a cladding layer disposed on the active layer, the cladding layer including a generally planar portion and a ridge portion;
   a cap layer disposed on the ridge portion of the cladding layer, the cap layer and ridge portion comprising a ridge structure, the ridge structure projecting away from the active layer with the generally planar portion of the cladding layer disposed between the active layer and the ridge structure, the ridge structure having side surfaces; and
   current blocking structures disposed at both sides of the ridge structure and including:
      $Al_xGa_{1-x}As$ first current blocking layers covering the generally planar portion of the cladding layer and the side surfaces of the ridge structure and having an Al composition x that gradually decreases from 1 at an interface with the cladding layer,
      GaAs second current blocking layers disposed on the first current blocking layers opposite the side surfaces of the ridge structure,
      $Al_yGa_{1-y}As$ third current blocking layers interposed between and contacting the first and second current blocking layers.

6. In a semiconductor laser comprising:
   an active layer and a cladding layer disposed on the active layer, the cladding layer including a generally planar portion and a ridge portion;
   a cap layer disposed on the ridge portion of the cladding layer, the cap layer and ridge portion comprising a ridge structure, the ridge structure projecting away from the active layer with the generally planar portion of the cladding layer disposed between the active layer and the ridge structure, the ridge structure having side surfaces; and current blocking structures disposed at both sides of the ridge structure and including:

$Al_xGa_{1-x}As$ first current blocking layers covering the generally planar portion of the cladding layer and the side surfaces of the ridge structure, each first current blocking layer comprising a plurality of AlAs monomolecular layers, and a plurality of GaAs monomolecular layers selected to produce an effective Al composition x of the first current blocking layers, and GaAs second current blocking layers disposed on the first current blocking layers opposite the side surfaces of the ridge structure.

7. In a semiconductor laser comprising:

successively laminated, a first cladding layer, an active layer, and a second cladding layer, part of the first cladding layer, the active layer, and the second cladding layer being formed in a ridge structure; and current blocking structures disposed at both sides of the ridge structure and including first current blocking layers covering a generally planar portion of the first cladding layer and side surfaces of the ridge structure, including side surfaces of the active and second cladding layers, each first current blocking layer comprising a plurality of monomolecular layers, each monomolecular layer comprising a two-element compound monocrystalline semiconductor material including elements selected from the group consisting of Al, Ga, In, As, and P.

8. The semiconductor laser of claim 1 wherein the ridge structure has a thickness relative to the generally planar portion of the cladding layer substantially equal to the total thickness of the first and second current blocking layers.

9. The semiconductor laser of claim 3 wherein the ridge structure has a thickness relative to the generally planar portion of the cladding layer substantially equal to the total thickness of the first, second, and third current blocking layers.

10. The semiconductor laser of claim 4 wherein the ridge structure has a thickness relative to the generally planar portion of the cladding layer substantially equal to the total thickness of the first, second, and third current blocking layers.

11. The semiconductor laser of claim 5 wherein the ridge structure has a thickness relative to the generally planar portion of the cladding layer substantially equal to the total thickness of the first, second, and third current blocking layers.

12. The semiconductor laser of claim 6 including $Al_yGa_{1-y}As$ third current blocking layers interposed between and contacting the first and second current blocking layers.

13. The semiconductor laser of claim 12 wherein the ridge structure has a thickness relative to the generally planar portion of the cladding layer substantially equal to the total thickness of the first, second, and third current blocking layers.

14. The semiconductor laser of claim 7 including a cap layer disposed on the second cladding layer, the ridge structure including the cap layer, and GaAs second current blocking layers disposed on and contacting the first current blocking layers at both sides of the ridge structure.

15. The semiconductor laser of claim 14 wherein the ridge structure has a thickness relative to the generally planar portion of the first cladding layer substantially equal to the total thickness of the first and second current blocking layers.

16. The semiconductor laser of claim 3 wherein the current blocking layers have a thickness on the side surfaces of the ridge structure and on the generally planar portion of the cladding layer of less than 0.7 $\mu$m.

* * * * *

UNITED STATES PATENT AND TRADEMARK OFFICE
CERTIFICATE OF CORRECTION

PATENT NO. : 5,822,350
DATED : October 13, 1998
INVENTOR(S) : Nishimura et al.

It is certified that error appears in the above-identified patent and that said Letters Patent is hereby corrected as shown below:

In the Abstract Line 1, change "includes"

(2nd occurrence) to --including--;

Column 14, Line 6, change "$Al_yGa_{1-x}As$"

to --$Al_yGa_{1-y}As$--.

Signed and Sealed this

Twenty-third Day of March, 1999

Attest:

Q. TODD DICKINSON

Attesting Officer

Acting Commissioner of Patents and Trademarks